United States Patent
Nakamura et al.

(10) Patent No.: US 11,683,093 B2
(45) Date of Patent: Jun. 20, 2023

(54) WAVELENGTH DISPERSION COMPENSATION APPARATUS, OPTICAL RECEIVING APPARATUS, WAVELENGTH DISPERSION COMPENSATION METHOD AND COMPUTER PROGRAM

(71) Applicant: Nippon Telegraph and Telephone Corporation, Tokyo (JP)

(72) Inventors: Masanori Nakamura, Musashino (JP); Seiji Okamoto, Musashino (JP); Kengo Horikoshi, Musashino (JP); Shuto Yamamoto, Musashino (JP); Takayuki Kobayashi, Musashino (JP); Yoshiaki Kisaka, Musashino (JP); Masahito Tomizawa, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 17/614,686

(22) PCT Filed: Jun. 6, 2019

(86) PCT No.: PCT/JP2019/022560
§ 371 (c)(1),
(2) Date: Nov. 29, 2021

(87) PCT Pub. No.: WO2020/245984
PCT Pub. Date: Dec. 10, 2020

(65) Prior Publication Data
US 2022/0224415 A1 Jul. 14, 2022

(51) Int. Cl.
*H04B 10/06* (2006.01)
*H04B 10/2513* (2013.01)
(Continued)

(52) U.S. Cl.
CPC ..... *H04B 10/2513* (2013.01); *H03H 17/0213* (2013.01); *H04B 10/61* (2013.01); *H04B 10/616* (2013.01)

(58) Field of Classification Search
CPC .. H04B 10/2513; H04B 10/61; H04B 10/616; H04B 10/6161; H04B 10/6162;
(Continued)

(56) References Cited

U.S. PATENT DOCUMENTS 8,649,689 B2 * 2/2014 Koizumi ............... H04L 27/223
398/208
2010/0325184 A1 12/2010 Kanayama et al.
(Continued)

FOREIGN PATENT DOCUMENTS

EP 3235147 11/2018
JP 2011-004264 1/2011
(Continued)

OTHER PUBLICATIONS

Slim et al., "Delayed Single-Tap Frequency-Domain Chromatic-Dispersion Compensation," IEEE Photonics Technology Letters, Jan. 15, 2013, 25(2):167-170.

*Primary Examiner* — Hanh Phan
(74) *Attorney, Agent, or Firm* — Fish & Richardson P.C.

(57) ABSTRACT

An electric digital received signal obtained from a received optical signal is segmented into blocks of a certain length with an overlap of a length determined in advance with an adjacent block. Fourier transformation is performed for each of the blocks. The blocks subjected to the Fourier transformation are stored consecutively in time series, a coefficient determined based on a wavelength dispersion compensation amount according to one of frequency positions and a delay amount according to one of the frequency positions and one of time positions is applied to each of frequency component values included in a plurality of the stored blocks, and the
(Continued)

blocks to which the coefficient has been applied and which are obtained by adding up the frequency component values to which the coefficient has been applied for each of the frequency positions are generated. Inverse Fourier transformation is performed on the generated blocks to which the coefficient has been applied. A part of the overlap subjected to the inverse Fourier transformation is removed.

8 Claims, 13 Drawing Sheets

(51) Int. Cl.
    *H03H 17/02* (2006.01)
    *H04B 10/61* (2013.01)
(58) Field of Classification Search
    CPC ............... H04B 10/6165; H04B 10/40; H04B 10/2507; H04B 10/6163; H04B 10/58
    USPC ....... 398/202, 204, 205, 206, 207, 208, 209, 398/210, 213, 214, 158, 159, 147, 81, 398/135, 136, 183, 188, 137, 138, 139
    See application file for complete search history.

(56) References Cited

U.S. PATENT DOCUMENTS

| | | |
|---|---|---|
| 2014/0356003 A1* | 12/2014 | Randel ................. H04B 10/616 398/208 |
| 2016/0094292 A1* | 3/2016 | Mochizuki ......... H04B 10/6165 398/208 |
| 2018/0248582 A1 | 8/2018 | Yasuda et al. |
| 2019/0044619 A1 | 2/2019 | Nakashima et al. |
| 2020/0067598 A1 | 2/2020 | Yoshida et al. |

FOREIGN PATENT DOCUMENTS

| | | |
|---|---|---|
| JP | 6376211 | 8/2018 |
| JP | 2019-029937 | 2/2019 |
| WO | WO 2013/139395 | 9/2013 |
| WO | WO 2017/033550 | 3/2017 |

* cited by examiner

WAVELENGTH DISPERSION COMPENSATION APPARATUS, OPTICAL RECEIVING APPARATUS, WAVELENGTH DISPERSION COMPENSATION METHOD AND COMPUTER PROGRAM

CROSS-REFERENCE TO RELATED APPLICATIONS

This application is a National Stage application under 35 U.S.C. § 371 of International Application No. PCT/JP2019/022560, having an International Filing Date of Jun. 6, 2019. The disclosure of the prior application is considered part of the disclosure of this application, and is incorporated in its entirety into this application.

TECHNICAL FIELD

The present invention relates to a wavelength dispersion compensation apparatus, an optical reception apparatus, a wavelength dispersion compensation method, and a computer program.

BACKGROUND ART

In digital coherent transmission, in order to compensate for waveform distortion generated in optical fibers, processing of equalization is performed by using digital signal processing (DSP). In recent years, with the aim of implementing longer distance transmission, an application range of the equalization processing has extended, and in the equalization processing, increase of a circuit scale and power consumption has been posing a problem.

CITATION LIST

Patent Literature

PTD 1: Japanese Patent No. 637621

SUMMARY OF THE INVENTION

Technical Problem

In the equalization processing, for example, in compensation for wavelength dispersion, a frequency domain equalizer is used (for example, see PTD 1). A wavelength dispersion amount that can be compensated for by the frequency domain equalizer is determined by spreading of impulses due to the wavelength dispersion, specifically, the magnitude of Fourier transformation and inverse Fourier transformation. Thus, in order to implement longer distance transmission, large fast Fourier transformation and inverse converter circuits are required, which poses a problem.

In view of the circumstances described above, the present invention has an object to provide a technique that is capable of increasing a wavelength dispersion compensation amount with a simple configuration without increasing the magnitude of fast Fourier transformation and inverse conversion.

Means for Solving the Problem

One aspect of the present invention is a wavelength dispersion compensation apparatus including a block division unit configured to segment an electric digital received signal obtained from a received optical signal into blocks of a certain length with an overlap of a length determined in advance with an adjacent block and output the blocks, a Fourier transform unit configured to perform Fourier transformation for each of the blocks output by the block division unit, a coefficient multiplication unit configured to store a plurality of the blocks converted by the Fourier transform unit consecutively in time series, apply a coefficient determined based on a wavelength dispersion compensation amount according to one of frequency positions and a delay amount according to one of the frequency positions and one of time positions to frequency component values included in the plurality of the blocks that are stored, and generate blocks with the coefficient applied, the blocks with the coefficient applied being obtained by adding up frequency component values with the coefficient applied for each of the frequency positions, an inverse Fourier transform unit configured to perform inverse Fourier transformation on the blocks with the coefficient applied that are generated by the coefficient multiplication unit, and an overlap cut unit configured to remove a part of the overlap from the blocks with the coefficient applied that are converted by the inverse Fourier transform unit.

One aspect of the present invention is the above-described wavelength dispersion compensation apparatus, in which the coefficient multiplication unit includes an adder and as many multiplier arrays as a number matching the number of the plurality of the blocks stored by the wavelength dispersion compensation amount, the multiplier arrays include as many multipliers as a number matching a length of the plurality of the blocks, each of the plurality of the multiplier arrays fetches a corresponding one of the blocks, multiplies, by the coefficient, a frequency value included in the corresponding one of the blocks that is fetched, and outputs a multiplication result, and the adder generates the blocks with the coefficient applied by adding up the frequency value included in the blocks output by the plurality of the multiplier arrays for each of the frequency positions.

One aspect of the present invention is the above-described wavelength dispersion compensation apparatus, in which the coefficient multiplication unit includes an adder, a lookup table processing unit configured to store coefficient multiplication results associated with all of bit patterns of a bit sequence of a bit length matching the number of the plurality of the blocks, in an internal storage area in advance, and a shift processing unit configured to multiply an immediately preceding output value of the adder by ½ and output a resulting value, the lookup table processing unit fetches a plurality of bit values corresponding to an identical bit position of the plurality of the blocks stored by the wavelength dispersion compensation amount, reads, from the internal storage area, the coefficient multiplication results associated with the bit patterns of the plurality of bit values that are fetched, and outputs the coefficient multiplication results, and the adder generates the blocks with the coefficient applied by repeatedly performing addition of the coefficient multiplication results output by the lookup table processing unit and the resulting value output from the shift processing unit according to positive and negative signs for all of bits of the blocks and outputs the blocks with the coefficient applied.

One aspect of the present invention is the above-described wavelength dispersion compensation apparatus, in which the coefficient is determined based on the wavelength dispersion compensation amount according to one of the frequency positions, the delay amount according to one of the frequency positions and one of the time positions, and an attenuation amount of a band-pass filter of a bandwidth according to one of the frequency positions.

One aspect of the present invention is the above-described wavelength dispersion compensation apparatus, in which a shape of the band-pass filter is a rectangular shape or a shape to which roll-off is given.

One aspect of the present invention is an optical reception apparatus including the above-described wavelength dispersion compensation apparatus as a wavelength dispersion compensation unit.

One aspect of the present invention is a wavelength dispersion compensation method including segmenting an electric digital received signal obtained from a received optical signal into blocks of a certain length with an overlap of a length determined in advance with an adjacent block, performing Fourier transformation for each of the blocks, storing a plurality of the blocks subjected to the Fourier transformation consecutively in time series, applying a coefficient determined based on a wavelength dispersion compensation amount according to one of frequency positions and a delay amount according to one of the frequency positions and one of time positions to frequency component values included in the plurality of the blocks that are stored, and generating blocks with the coefficient applied, the blocks with the coefficient applied being obtained by adding up frequency component values with the coefficient applied for each of the frequency positions, performing inverse Fourier transformation on the generated blocks with the coefficient applied that are generated, and removing a part of the overlap subjected to the inverse Fourier transformation.

One aspect of the present invention is a computer program for causing a computer to execute segmenting an electric digital received signal obtained from a received optical signal into blocks of a certain length with an overlap of a length determined in advance with an adjacent block and outputting the blocks, performing Fourier transformation for each of the blocks, storing a plurality of the blocks subjected to the Fourier transformation consecutively in time series, applying a coefficient determined based on a wavelength dispersion compensation amount according to one of frequency positions and a delay amount according to one of the frequency positions and one of time positions to frequency component values included in the plurality of the blocks that are stored, and generating blocks with the coefficient applied, the blocks with the coefficient applied being obtained by adding up frequency component values with the coefficient applied for each of the frequency positions, performing inverse Fourier transformation on the blocks with the coefficient applied that are generated, and removing a part of the overlap subjected to the inverse Fourier transformation.

Effects of the Invention

According to the present invention, the wavelength dispersion compensation amount can be increased with a simple configuration without increasing the magnitude of fast Fourier transformation and inverse conversion.

DESCRIPTION OF EMBODIMENTS

Figure 1:
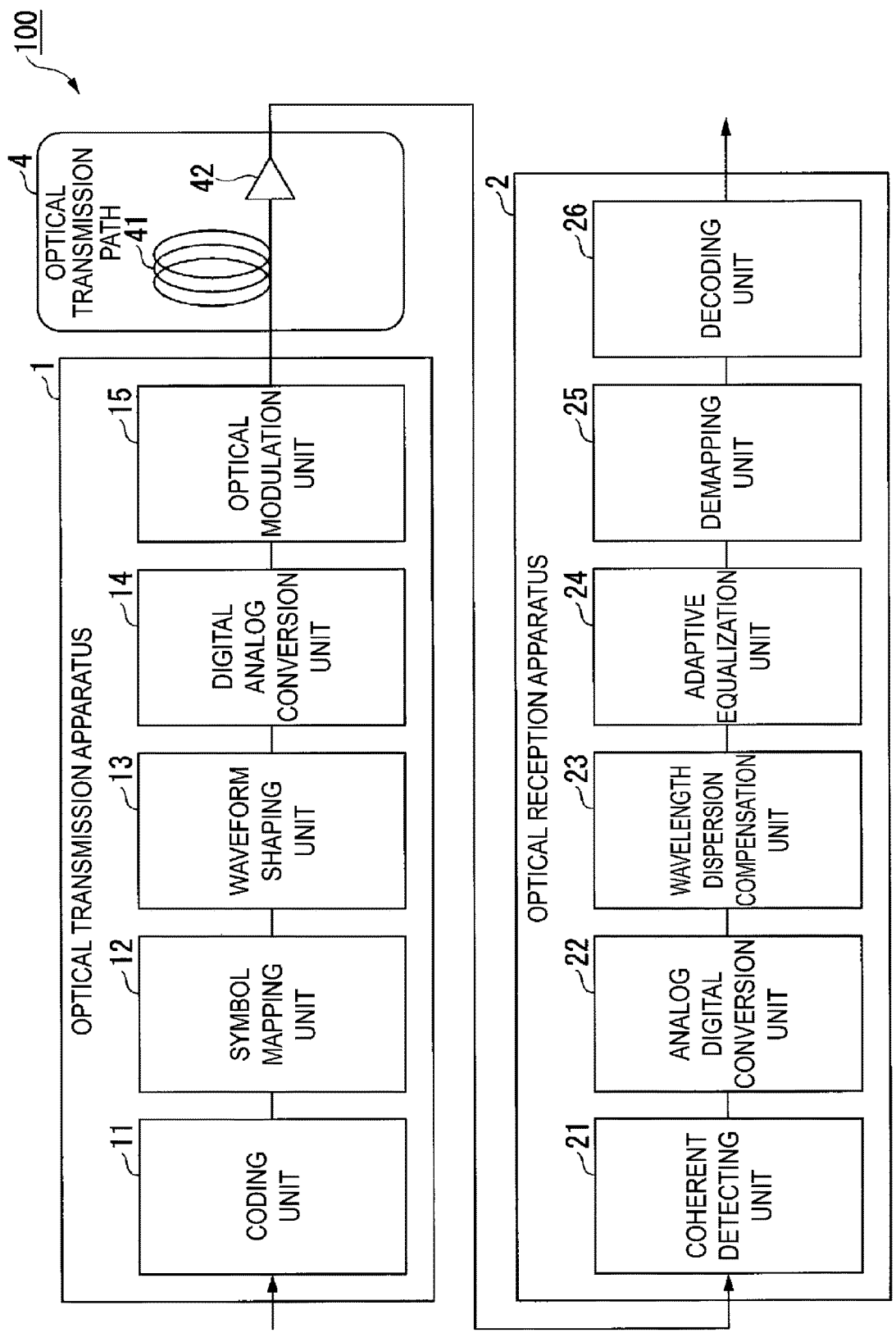
FIG. 1 is a block diagram illustrating a configuration of an optical transmission system according to an embodiment of the present invention.

An embodiment of the present invention will be described below with reference to the drawings. FIG. 1 is a block diagram illustrating a configuration of an optical transmission system 100 according to an embodiment of the present invention. The optical transmission system 100 includes an optical transmission apparatus 1, an optical reception apparatus (optical receiving apparatus) 2, and an optical transmission path 4.

The optical transmission apparatus 1 includes a coding unit 11, a symbol mapping unit 12, a waveform shaping unit 13, a digital analog conversion unit 14, and an optical modulation unit 15.

The coding unit 11 codes a bit sequence given from the outside by using any error correction code that is determined in advance.

The symbol mapping unit 12 maps the coded bit sequence to symbols by using any modulation scheme that is determined in advance out of modulation schemes such as Quadrature Phase Shift Keying (QPSK) and Quadrature Amplitude Modulation (QAM). The waveform shaping unit 13 performs waveform shaping on the symbol sequence output by the symbol mapping unit 12 by means of Nyquist filtering or the like.

The digital analog conversion unit 14 converts a digital signal, which is the symbol sequence that has been subjected to the waveform shaping and output by the waveform shaping unit 13, into an analog signal.

The optical modulation unit 15 converts the electric analog signal output by the digital analog conversion unit 14 into an optical signal, and transmits the optical signal to the optical reception apparatus 2 through the optical transmission path 4.

The optical reception apparatus 2 includes a coherent detecting unit 21, an analog digital conversion unit 22, a wavelength dispersion compensation unit (wavelength dispersion compensator) 23, an adaptive equalization unit 24, a demapping unit 25, and a decoding unit 26.

The coherent detecting unit 21 causes the received optical signal and a locally generated light to interfere with each other, and converts the optical signal into a baseband analog electric signal.

The analog digital conversion unit 22 converts the analog electric signal output by the coherent detecting unit 21 into a digital electric signal.

The wavelength dispersion compensation unit 23 compensates for wavelength dispersion caused in the transmission path, by means of digital signal processing such as a Finite Impulse Response (FIR) filter and frequency domain equalization.

The adaptive equalization unit 24 dynamically estimates and equalizes dynamically varying polarized waves, laser phase noise, and the like that are generated in the optical transmission path 4, by means of digital signal processing such as an FIR filter and frequency domain equalization.

The demapping unit 25 converts symbol information of the signal equalized by the adaptive equalization unit 24 into a bit sequence.

The decoding unit 26 performs error correction on the bit sequence output by the demapping unit 25, by using an error correction decoding scheme that corresponds to the error correction coding performed by the coding unit 11.

The optical transmission path 4 includes an optical fiber 41 and an optical amplifier 42, and transmits the optical signal transmitted by the optical transmission apparatus 1 to the optical reception apparatus 2.

Figure 2:
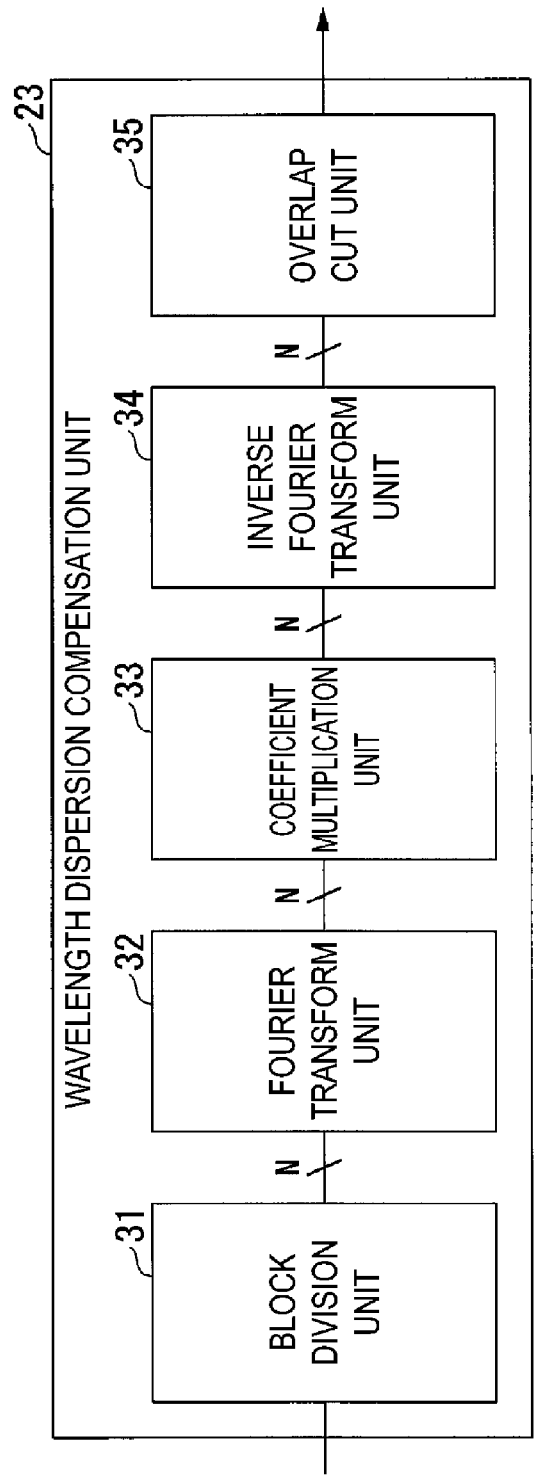
FIG. 2 is a block diagram illustrating a configuration of a wavelength dispersion compensation unit according to the present embodiment.

As illustrated in FIG. 2, the wavelength dispersion compensation unit 23 includes a block division unit (block divider) 31, a Fourier transform unit (Fourier transformer) 32, a coefficient multiplication unit (coefficient multiplier) 33, an inverse Fourier transform unit (inverse Fourier transformer) 34, and an overlap cut unit (overlap cutter) 35. In FIG. 2, "N" shown on the connection line between the functional units denotes that blocks including N values are input and output. This is assumed to be similarly applied to other figures subsequent to FIG. 2 as well.

The Fourier transform unit 32 performs Fourier transformation on the blocks that are sequentially output by the block division unit 31. Specifically, the Fourier transform unit 32 converts a time domain signal of N samples into a frequency domain signal of N bins. When the Fourier transform unit 32 performs Fourier transformation, the Fourier transform unit 32 performs discrete Fourier transform or fast Fourier transformation.

The coefficient multiplication unit 33 multiplies, by a different coefficient, each value of each bin of the frequency domain signal output by the Fourier transform unit 32.

Figure 3:
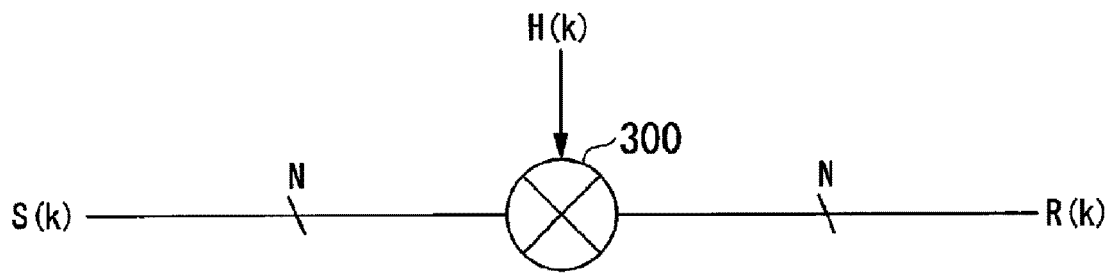
FIG. 3 is a block diagram illustrating a configuration of a coefficient multiplication unit of a single stage configuration.
Figure 4:
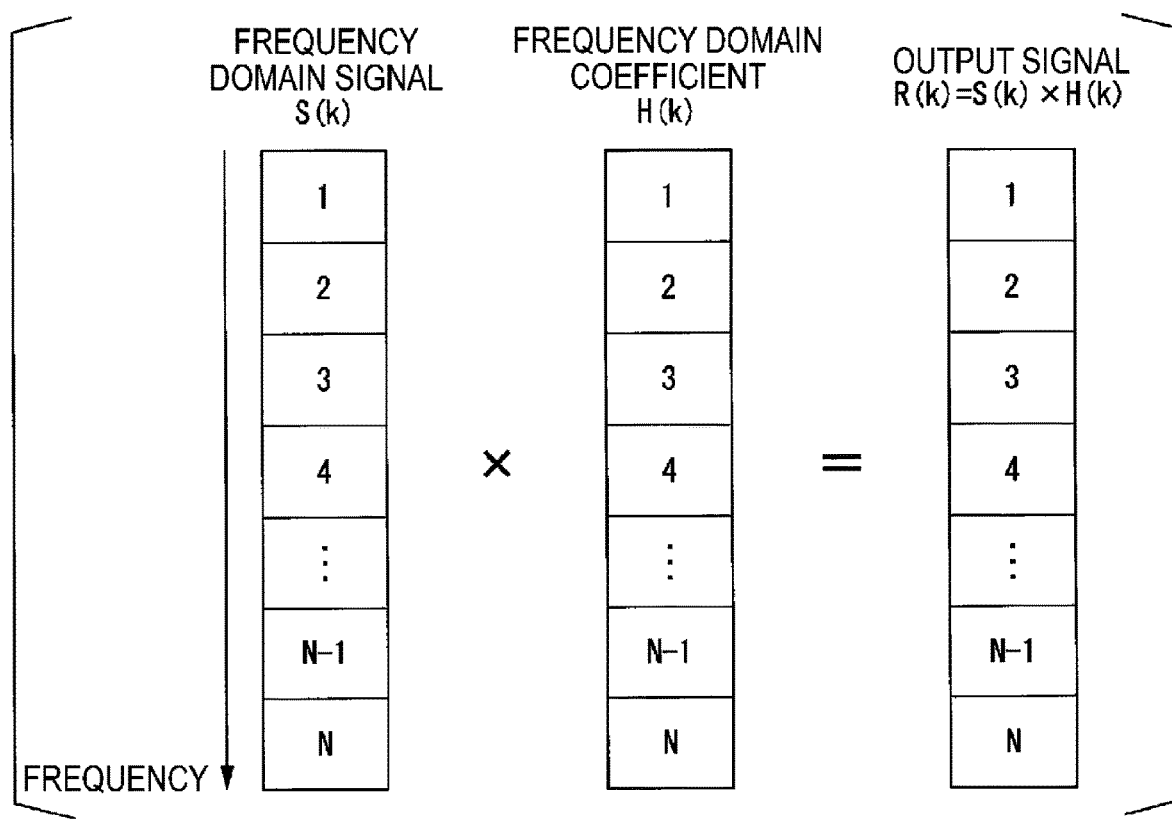
FIG. 4 is a diagram illustrating operation of the coefficient multiplication unit of a single stage configuration.

In a general configuration in which wavelength dispersion compensation is performed, the functional unit that multiplies a coefficient employs a configuration of including one multiplier 300 as illustrated in FIG. 3, for example. As illustrated in FIG. 4, the functional unit that multiplies a coefficient calculates an output signal R (k) by multiplying a signal S (k) in the frequency domain, which is the frequency domain signal output by the Fourier transform unit 32, by H (k), which is a coefficient in the frequency domain, by using the multiplier 300. Here, k is an integer that represents a position in the frequency domain, and 1 corresponds to a frequency of zero.

The coefficient H (k) is a value shown in the following equation (1).

[Math. 1]

$$H(k) = \exp\left(\frac{j}{2}\beta_2 \omega^2\right) \quad (1)$$

In the equation (1), $\beta_2$ is a wavelength dispersion parameter. $\omega$ is represented by the following equation (2), and its value varies depending on the frequency. Thus, signals of each of the bins of the frequency are multiplied by coefficients different from each other.

[Math. 2]

$$\omega = 2\pi f \quad (2)$$

Figure 5:
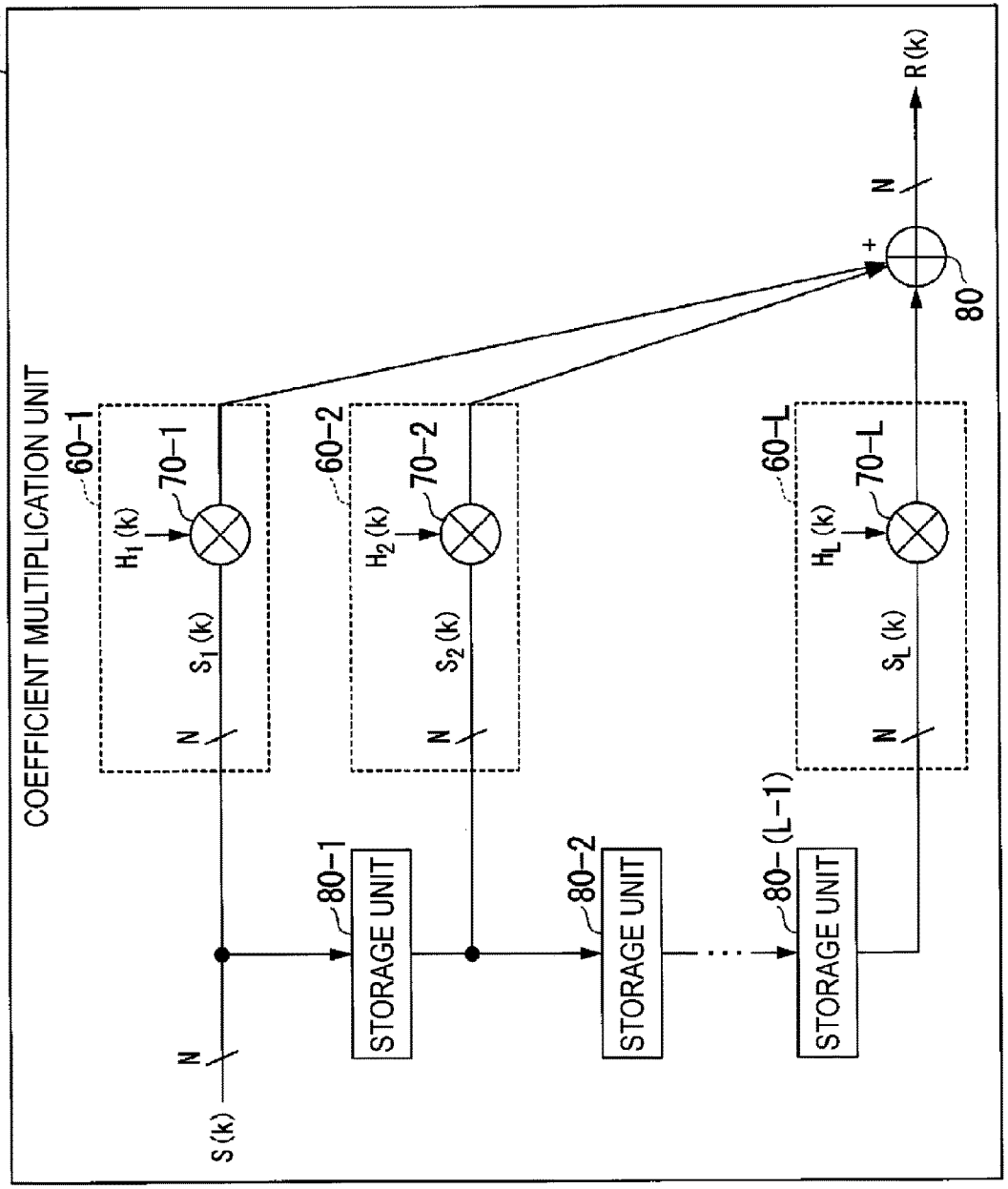
FIG. 5 is a block diagram (no. 1) illustrating a configuration of a coefficient multiplication unit according to the present embodiment.

In contrast, in the present embodiment, as illustrated in FIG. 5, the coefficient multiplication unit 33 includes storage units 80-1 to 80-(L−1), multiplier arrays 70-1 to 70-L, and an adder 80. For the sake of convenience of description, each of the configurations denoted by the reference signs 60-1 to 60-L respectively including the multiplier arrays 70-1 to 70-L is referred to as a stage number. Note that, provided that L is an integer equal to or greater than 2 and the configuration illustrated in FIG. 3 is a single stage configuration, it can be said that the coefficient multiplication unit 33 has a multi-stage configuration.

Each of the storage units 80-1 to 80-(L−1) stores blocks that are output by the Fourier transform unit 32 per unit time. For example, when the block at time t output by the Fourier transform unit 32 is $S_1$ (k), the storage unit 80-1 stores a block $S_2$ (k) at time t−1. The storage unit 80-2 stores a block $S_3$ (k) at time t−2. The last storage unit 80-(L−1) stores a block $S_L$ (k) at time t−L+1.

The multiplier array 70-1 multiplies the block $S_1$ (k) output by the Fourier transform unit 32 by a coefficient $H_1$ (k) that is determined in advance. The multiplier arrays 70-2 to 70-L respectively fetch the blocks $S_2$ (k) to $S_L$ (k) that are stored by the storage units 80-1 to 80-(L−1). The multiplier arrays 70-2 to 70-L respectively multiply the fetched blocks $S_2$ (k) to $S_L$ (k) by coefficients $H_2$ (k) to $H_L$ (k) that are each determined in advance. Each of the multiplier arrays 70-1 to 70-L outputs a multiplication result to the adder 80. Each of the multiplier arrays 70-1 to 70-L includes as many multipliers as the number that matches the length of the blocks output by the Fourier transform unit 32. This is because as many multipliers as the number calculated by "number of blocks×length of blocks" are required.

Figure 6:
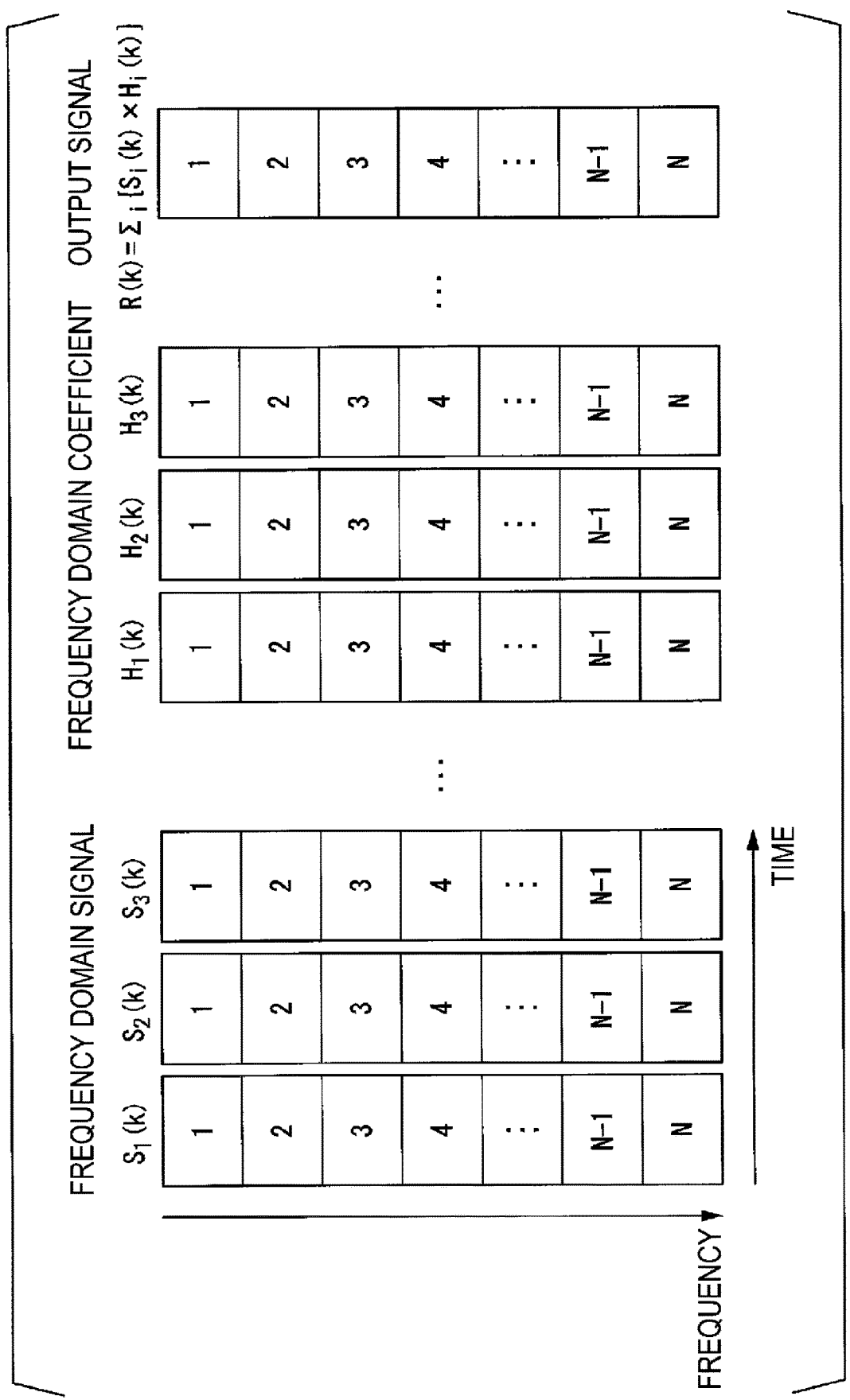
FIG. 6 is a diagram illustrating operation of the coefficient multiplication unit according to the present embodiment.

As illustrated in FIG. 6, the adder 80 adds the multiplication results output by the multiplier arrays 70-1 to 70-L for each bin. In this manner, the adder 80 calculates an output signal R (k) that includes N values. Note that, in FIG. 6, "i" is an integer from 1 to L.

Here, the coefficients $H_1$ (k) to $H_L$ (k) are each a value shown in the following equation (3).

[Math. 3]

$$H_l(k) = B_l(\omega) \times \exp\left(\frac{j}{2}\beta_2 \omega^2 - jl\beta_1 \omega\right) \quad (3)$$

In the equation (3), l is from 1 to L, and $\omega$ is expressed by the following equation (4).

[Math. 4]

$$\omega = 2\pi \Delta f(k-1) \quad (4)$$

In the equation (3), $\beta_1$ is expressed by the following equation (5).

[Math. 5]
$$\beta_1 = \Delta t \times N(M-1)/M \qquad (5)$$

Specifically, the coefficients $H_1$ (k) to $H_L$ (k) respectively multiplied by the multiplier arrays 70-1 to 70-L are values different for each of the stage numbers 60-1 to 60-L, and are coefficients different for each of the bins of the frequency. In the equation (3), the argument of exp consists of the first term being a quadratic component of $\omega$ and the second term being a liner component of $\omega$, which correspond to wavelength dispersion compensation and delay compensation, respectively. The second term is necessary for compensating for delay times that are different depending on the stage number.

Figure 7:
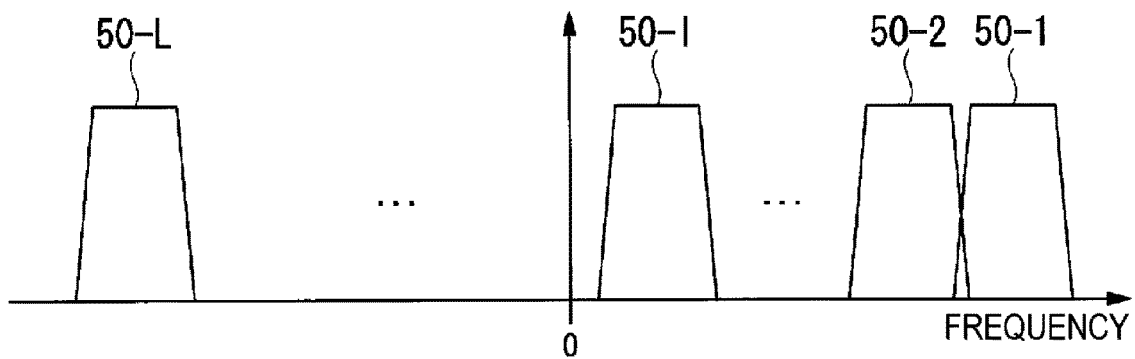
FIG. 7 is a diagram illustrating a configuration of a band-pass filter according to the present embodiment.

In the equation (3), $B_1$ ($\omega$) is a band-pass filter, specifically, a window function. $B_1$ ($\omega$) to $B_L$ ($\omega$) are band-pass filters 50-1 to 50-L whose positions of the center frequency are different, as illustrated in FIG. 7, for example. Specifically, the band-pass filter 50-1 of the highest frequency is applied to the stage number 60-1 assigned the smallest number. Then, in sequential order, the band-pass filters 50-2, 50-3, . . . are applied to the stage numbers 60-2, 60-3, . . . , and the band-pass filter 50-L of the lowest frequency is applied to the stage number 60-L assigned the largest number. The optical signal that has been subjected to the wavelength dispersion has different delay times depending on the frequency. Thus, with these band-pass filters 50-1 to 50-L, processing of extracting only an appropriate frequency according to wavelength dispersion is performed.

The inverse Fourier transform unit 34 performs inverse Fourier transformation for each of the blocks that are output by the coefficient multiplication unit 33. Specifically, the inverse Fourier transform unit 34 converts a frequency domain signal of N bins into a time domain signal of N samples. When the inverse Fourier transform unit 34 performs inverse Fourier transformation, the inverse Fourier transform unit 34 performs inverse discrete Fourier transform or inverse fast Fourier transformation.

The overlap cut unit 35 cuts a part of 1/M being an overlapping part from the block output by the inverse Fourier transform unit 34, performs parallel serial conversion on the cut block, and thus outputs a sample having a length of N(M−1)/M.

Figure 8:
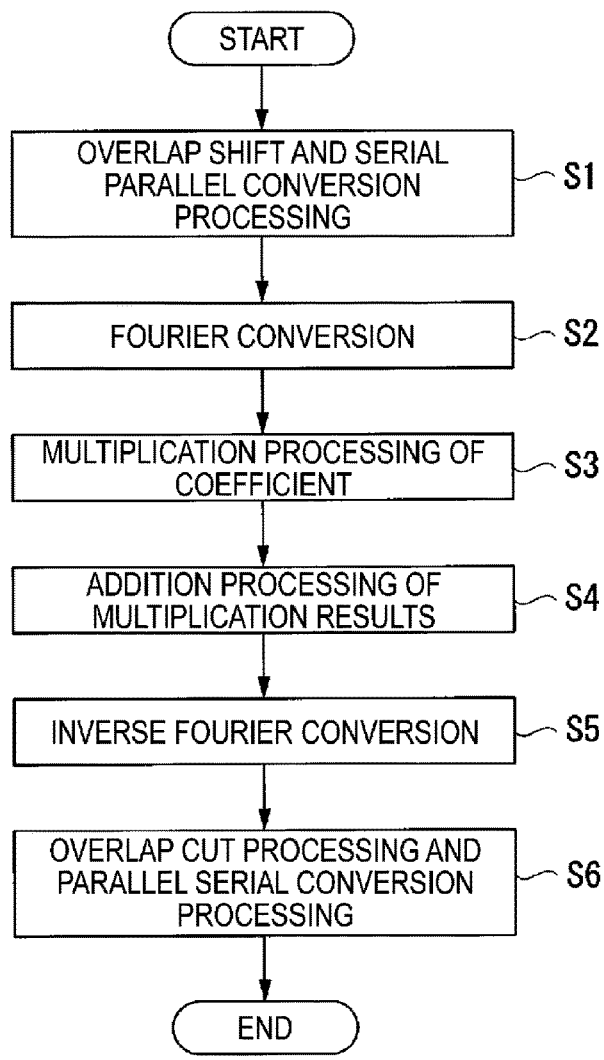
FIG. 8 is a flowchart illustrating a procedure of processing of the wavelength dispersion compensation unit according to the present embodiment.
Figure 9:
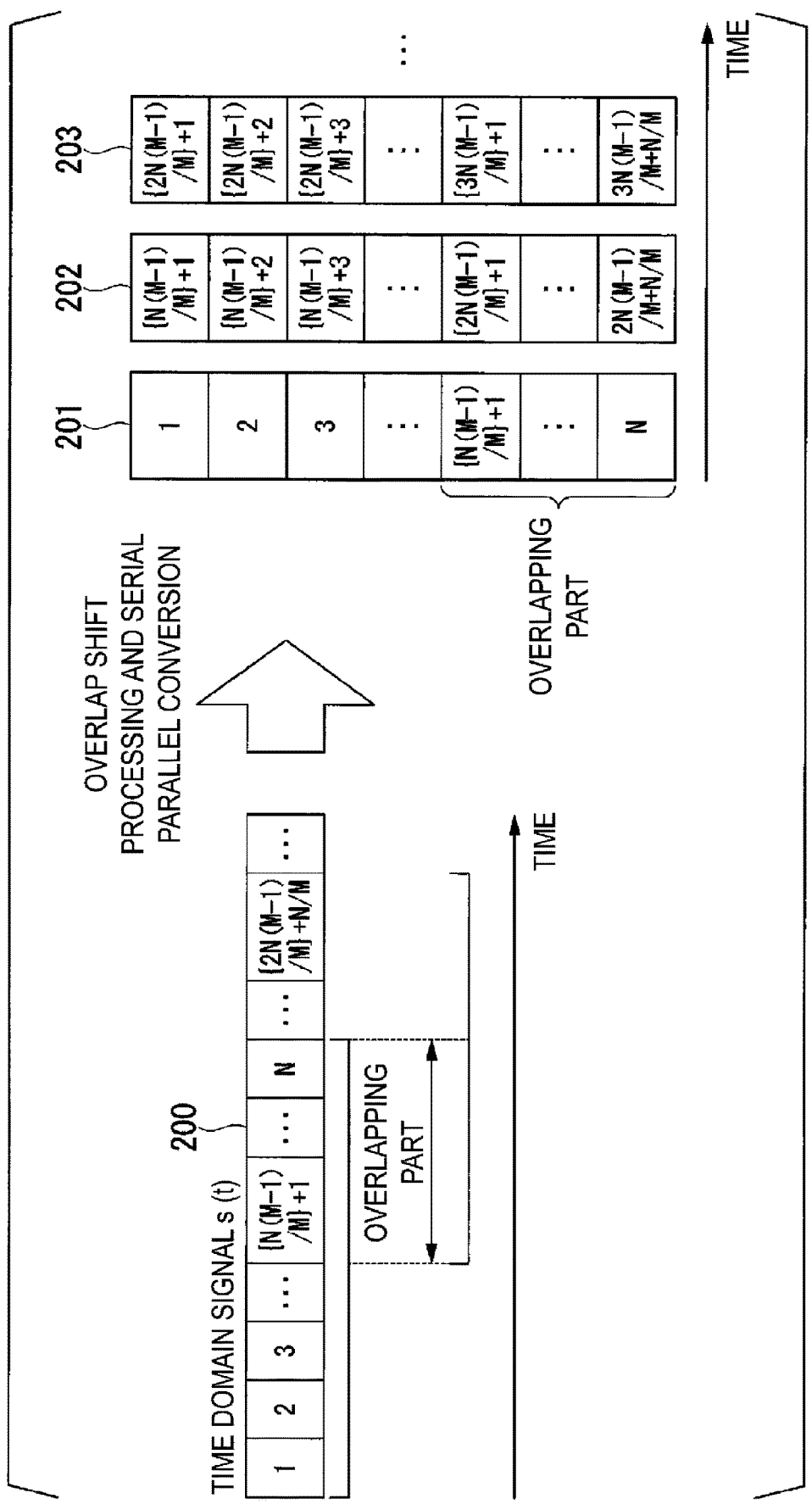
FIG. 9 is a diagram illustrating processing of a block division unit according to the present embodiment.

Processing Performed by Wavelength Dispersion Compensation Unit FIG. 8 is a flowchart illustrating a procedure of processing performed by the wavelength dispersion compensation unit. The block division unit 31 fetches the digital signal output by the analog digital conversion unit 22, for example, a digital time domain signal s (t) 200 illustrated in FIG. 9. Note that the numerical values in each box of the time domain signal s (t) 200 are values of "t" representing time.

The block division unit 31 divides the time domain signal s (t) 200 into a plurality of blocks by shifting intervals of the blocks so that there is an overlap of N/M with an adjacent block. The block division unit 31 generates blocks 201, 202, 203, . . . illustrated in FIG. 9 by buffering the plurality of blocks generated through the division in an internal storage area and performing serial parallel conversion. The block division unit 31 outputs the generated blocks 201, 202, 203, . . . to the Fourier transform unit 32 for each of the blocks (Step S1).

The Fourier transform unit 32 performs Fourier transformation on the blocks sequentially output by the block division unit 31 (Step $S_2$).

The coefficient multiplication unit 33 performs the following processing on the blocks of each of the frequency domain signals segmented into the blocks of each of the N bins output by the Fourier transform unit 32. Specifically, the coefficient multiplication unit 33 multiplies a coefficient $H_1$ (k) being a value different for each time position (each of the stage numbers 60-1 to 60-L) and different for each frequency position.

Figure 10:
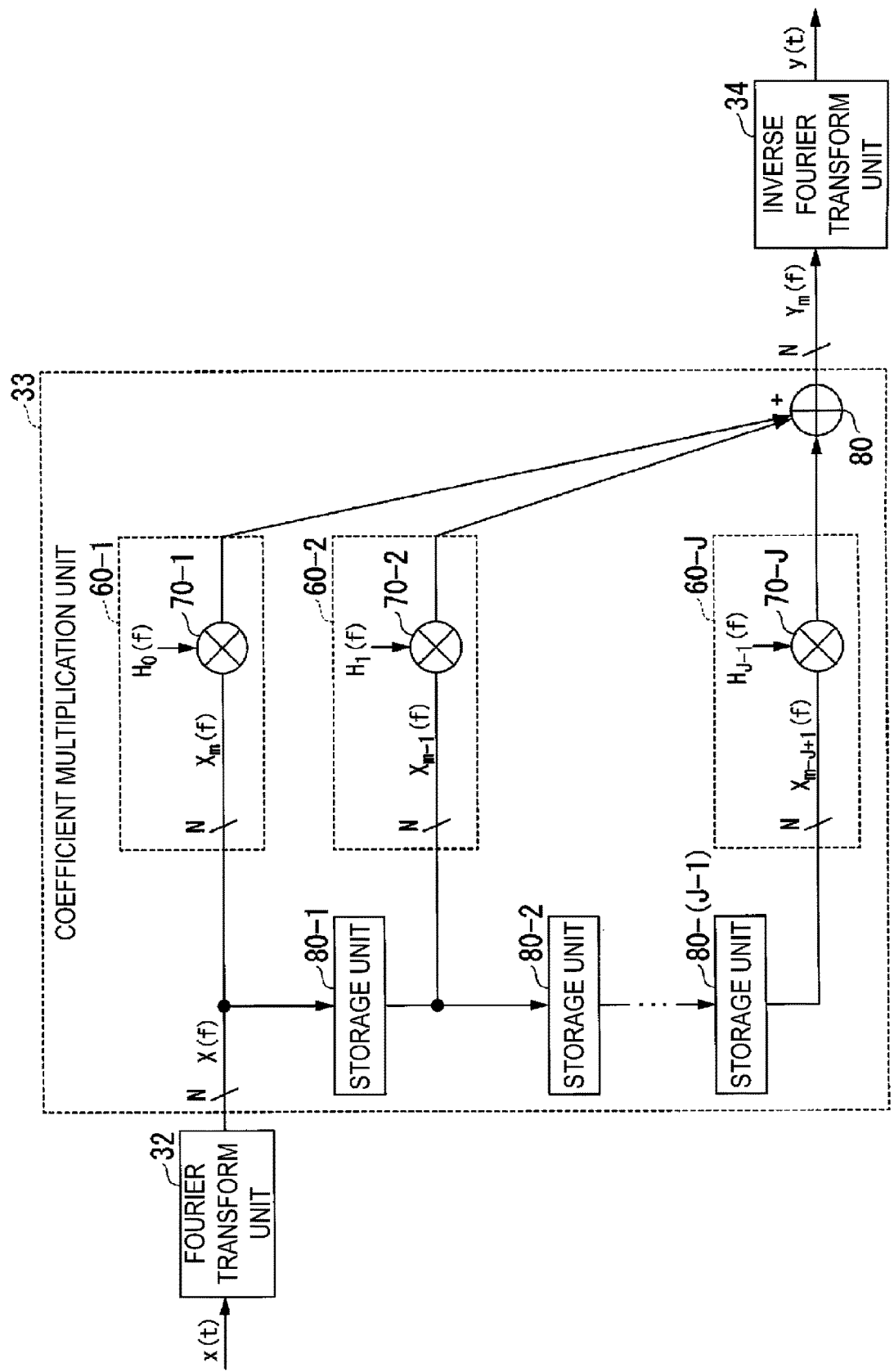
FIG. 10 is a block diagram (no. 2) illustrating a configuration of the coefficient multiplication unit according to the present embodiment.

With reference to FIG. 10, multiplication processing of the coefficient $H_1$ (k) performed by the coefficient multiplication unit 33 will be described. Note that, in FIG. 5, the numbers of the stage numbers 60-1 to 60-L are represented by "L", whereas in FIG. 10, the numbers are represented by "J" instead.

As illustrated in FIG. 10, each of the blocks 201, 202, 203, . . . output by the block division unit 31 is represented by a time domain signal x (t). An output of the inverse Fourier transform unit 34 is represented by a time domain signal y (t). Here, if a coefficient to be multiplied is represented by h (n) expressed by a value in the time domain, the multiplication processing performed by the coefficient multiplication unit 33 is expressed by the following equation (6).

[Math. 6]
$$y[t] = \sum_{n=0}^{N_J-1} h(n)x(t-n) \qquad (6)$$

As shown in the equation (6), y[t] is a result of convolution operation of the coefficient h (n) and the time domain signal x (t). By decomposing the equation (6) in groups of N, the following equation (7) is obtained.

[Math. 7]
$$y[t] = \sum_{n=0}^{N_0-1} h(n)x(t-n) + \sum_{n=N_0}^{N_1-1} h(n)x(t-n) + \ldots + \sum_{n=N_{J-1}}^{N_J-1} h(n)x(t-n) \qquad (7)$$

In the equation (7), each of $N_0$, $N_1$, . . . , $N_J$ has the same value. The number of n=0 to $N_0$, the number of n=$N_0$ to $N_1-1$, . . . , and the number of n=$N_{J-1}$ to $N_J-1$ are all N.

The Fourier transform unit 32 generates a frequency domain signal X (f) by performing Fourier transformation on the time domain signal x (t) (Step $S_2$). The frequency domain signal before inverse Fourier transformation is performed on the time domain signal y (t) being an output of the inverse Fourier transform unit 34 is represented by $Y_m$ (f). In this case, the relationship between X (f) and $Y_m$ (f) is as shown in the following equation (8), which is a result of multiplication operation of the frequency domain coefficient H (f) and the frequency domain signal X (f).

[Math. 8]
$$Y_m(f) = H(f) \times X(f) = \qquad (8)$$
$$H_0(f) \times X_m(f) + H_1(f) \times X_{m-1}(f) + \ldots + H_{J-1}(f) \times X_{m-J+1}(f)$$

The last expression of the equation (8) is an expression obtained by decomposing H (f)×X (f) in groups of N bins of the frequency, and is an expression obtained by performing Fourier transformation on the expression on the right-hand side of the equation (7). It can be said that the coefficient multiplication unit 33 of FIG. 10 is a functional unit that performs operations on the last expression of the equation (8) by using multiplier arrays 70-1 to 70-J and the adder 80.

Note that, in FIG. 10, "f" represents frequency, which corresponds to "k" shown in FIG. 5. In FIG. 10, a suffix "m" is added to the frequency domain signals X (f) sequentially output by the Fourier transform unit 32 to be represented by $X_m$ (f), $X_{m-1}$ (f), . . . , $X_{m-J+1}$ (f) in time series, which respectively correspond to $S_1$ (k), $S_2$ (k), SL (k) of FIG. 5. Coefficients $H_0$ (f), $H_1$ (f), . . . , $H_{J-1}$ (f) shown in FIG. 10 respectively correspond to $H_1$ (k), $H_2$ (k), . . . , $H_L$ (k) of FIG. 5. $Y_m$ (f) corresponds to R (k) of FIG. 5.

Each of the storage units 80-1 to 80-(J-1) store blocks that are output by the Fourier transform unit 32 per unit time. For example, when the block at time t output by the Fourier transform unit 32 is $X_m$ (f), the storage unit 80-1 stores a block $X_{m-1}$ (f) at time t−1. The storage unit 80-2 stores a block $X_{m-2}$ (f) at time t−2. The last storage unit 80-(J-1) stores a block $X_{m-J+1}$ (f) at time t−J+1.

The multiplier arrays 70-1 to 70-J respectively fetch the frequency domain signals $X_{m-1}$ (f) to $X_{m-J+1}$ (f) from the storage units 80-1 to 80-(J-1). The multiplier arrays 70-1 to 70-J respectively multiply the fetched $X_{m-1}$ (f), $X_{m-2}$ (f), . . . , $X_{m-J+1}$ (f) and the frequency domain coefficients $H_0$ (f), $H_1$ (f), . . . , $H_{J-1}$ (f). Then, each of the multiplier arrays 70-1 to 70-J outputs a multiplication result to the adder 80 (Step $S_3$).

The adder 80 calculates a frequency domain signal $Y_m$ (f) by adding the multiplication results that are output by the multiplier arrays 70-1 to 70-J (Step S4). The inverse Fourier transform unit 34 generates the time domain signal y (t) by performing inverse Fourier transformation on the frequency domain signal $Y_m$ (f) and outputs the time domain signal y (t) (Step S5).

Figure 11:
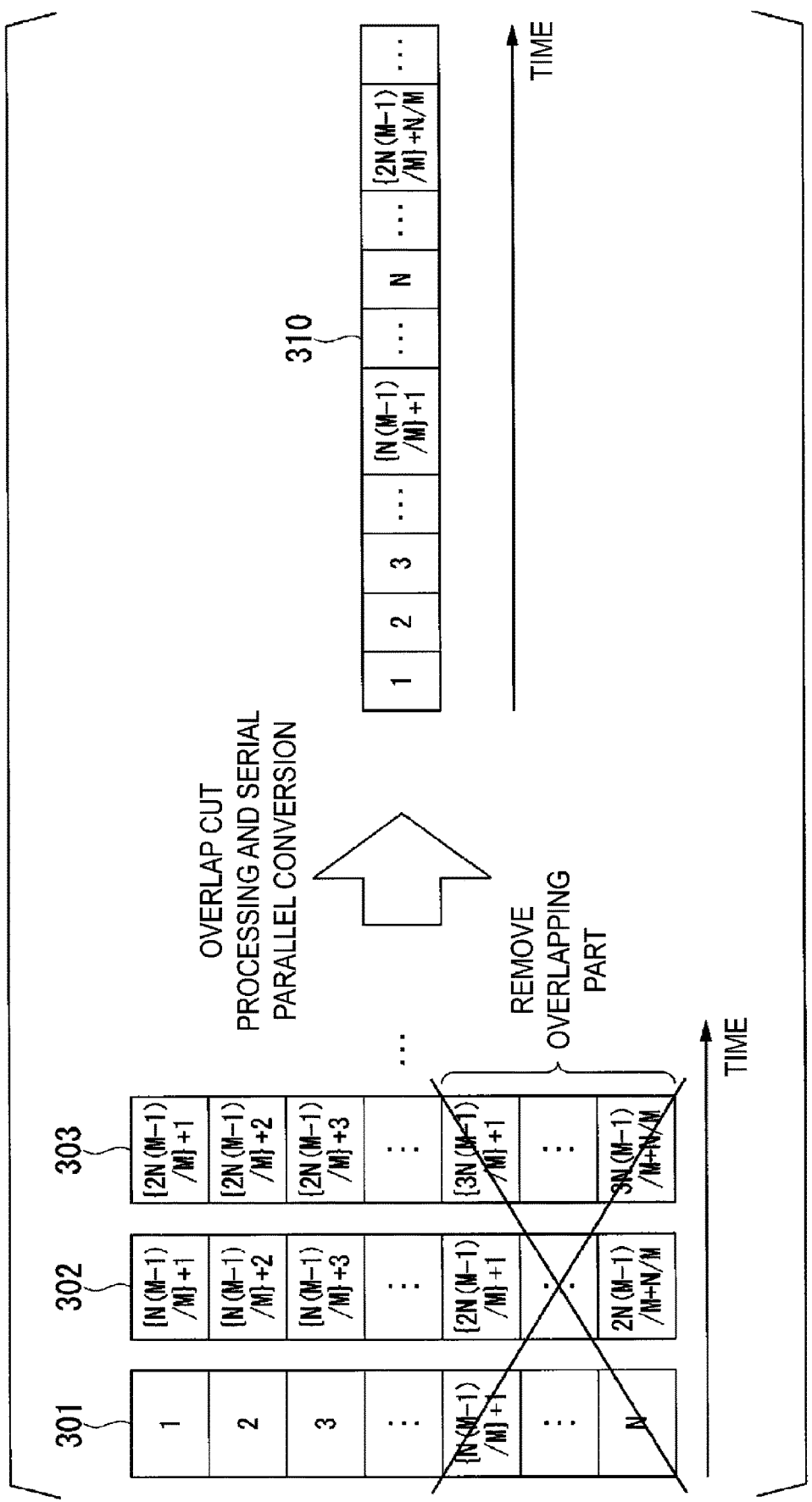
FIG. 11 is a diagram illustrating processing of an overlap cut unit according to the present embodiment.

As illustrated in FIG. 11, the overlap cut unit 35 cuts a part of 1/M being an overlapping part from each of blocks 301, 302, 303, . . . included in the time domain signal y (t) output by the inverse Fourier transform unit 34. Specifically, as illustrated in FIG. 11, the overlap cut unit 35 removes the {N(M−1)/M)+1}-th to N-th elements of each of the blocks 301, 302, 303, . . . . The overlap cut unit 35 generates a serial signal 310 by performing parallel serial conversion on each of the blocks including N(M−1)/M samples from which the overlapping part has been removed and outputs the serial signal 310 (Step S6).

Reduction of Operation Amount by Band-Pass Filter $B_1$ (ω)

As shown in the equation (3), the coefficient $H_1$ (k) is determined by an attenuation amount of the band-pass filter $B_1$ (ω) and an amount to compensate for wavelength dispersion and delay represented by exp. As illustrated in FIG. 7, the band-pass filter $B_1$ (ω) is a band-pass filter having a fixed width with its center frequency being a frequency position different for each of the stage numbers 60-1 to 60-L to be applied.

Hypothetically, it is assumed that $B_1$ (ω) is removed from the coefficient $H_1$ (k) of the equation (3), and the coefficient $H_1$ (k) consists only of the term of exp. In this case, the coefficient h (n) represented in the time domain shown in the equations (6) and (7) is a chirped pulse-like function. If the coefficient h (n) is converted into that of the frequency domain, a high frequency component appears in the smallest stage numbers out of the stage numbers 60-1 to 60-L, for example, the stage number 60-1, 60-2, or the like, and a low frequency component appears in the largest stage numbers, for example, the stage number 60-(L−1), 60-L, or the like.

Thus, in the smallest stage numbers such as the stage number 60-1, 60-2, or the like, there is no need to perform operation on the low frequency component. In contrast, in the stage number 60-(L−1), 60-L, or the like, there is no need to perform operation on the high frequency component. Thus, by determining coefficient $H_1$ (k) in advance by taking the attenuation amount of the band-pass filters 50-1 to 50-L as illustrated in FIG. 7 into consideration, the frequency domain that does not necessarily require operations can be masked, which allows for reduction of the operation amount.

It is desirable that the shape of the band-pass filters 50-1 to 50-L be a rectangular shape from the point of view of reduction of the operation amount. However, applying the rectangular shape leads to convolution of a Sinc function in the time domain. Thus, when the length "N" of the block has a small value, the Sinc function is applied beyond the block. Thus, appropriate operation results cannot be obtained. In this case, by giving roll-off to the shape of the band-pass filter, an adjustment can be made so that appropriate operation results can be obtained.

In the wavelength dispersion compensation unit 23 of the optical reception apparatus 2 according to the embodiment described above, the block division unit 31 segments the electric digital received signal obtained from the received optical signal into blocks having a certain length so that there is an overlap having a length determined in advance with an adjacent block and outputs the blocks. The Fourier transform unit 32 performs Fourier transformation for each of the blocks output by the block division unit 31. The coefficient multiplication unit 33 stores the plurality of blocks consecutively in time series from the blocks converted by the Fourier transform unit 32. The coefficient multiplication unit 33 applies a coefficient determined based on the wavelength dispersion compensation amount according to the frequency position and the delay amount according to the frequency position and the time position to each of the frequency component values included in the plurality of stored blocks, and generates the blocks to which the coefficient has been applied and which are obtained by adding up the frequency component values to which the coefficient has been applied for each of the frequency positions. The inverse Fourier transform unit 34 performs inverse Fourier transformation on the blocks to which the coefficient has been applied and which are generated by the coefficient multiplication unit 33. The overlap cut unit 35 removes a part of the overlap from the blocks converted by the inverse Fourier transform unit 34. With such a configuration as described above, owing to the plurality of stored blocks, it is possible to perform wavelength dispersion compensation targeting a wide frequency range while maintaining the magnitude of Fourier transformation and inverse Fourier transformation. Specifically, the wavelength dispersion compensation amount can be increased with a simple configuration without increasing the magnitude of fast Fourier transformation and inverse conversion.

Simulation Results

Figure 12:
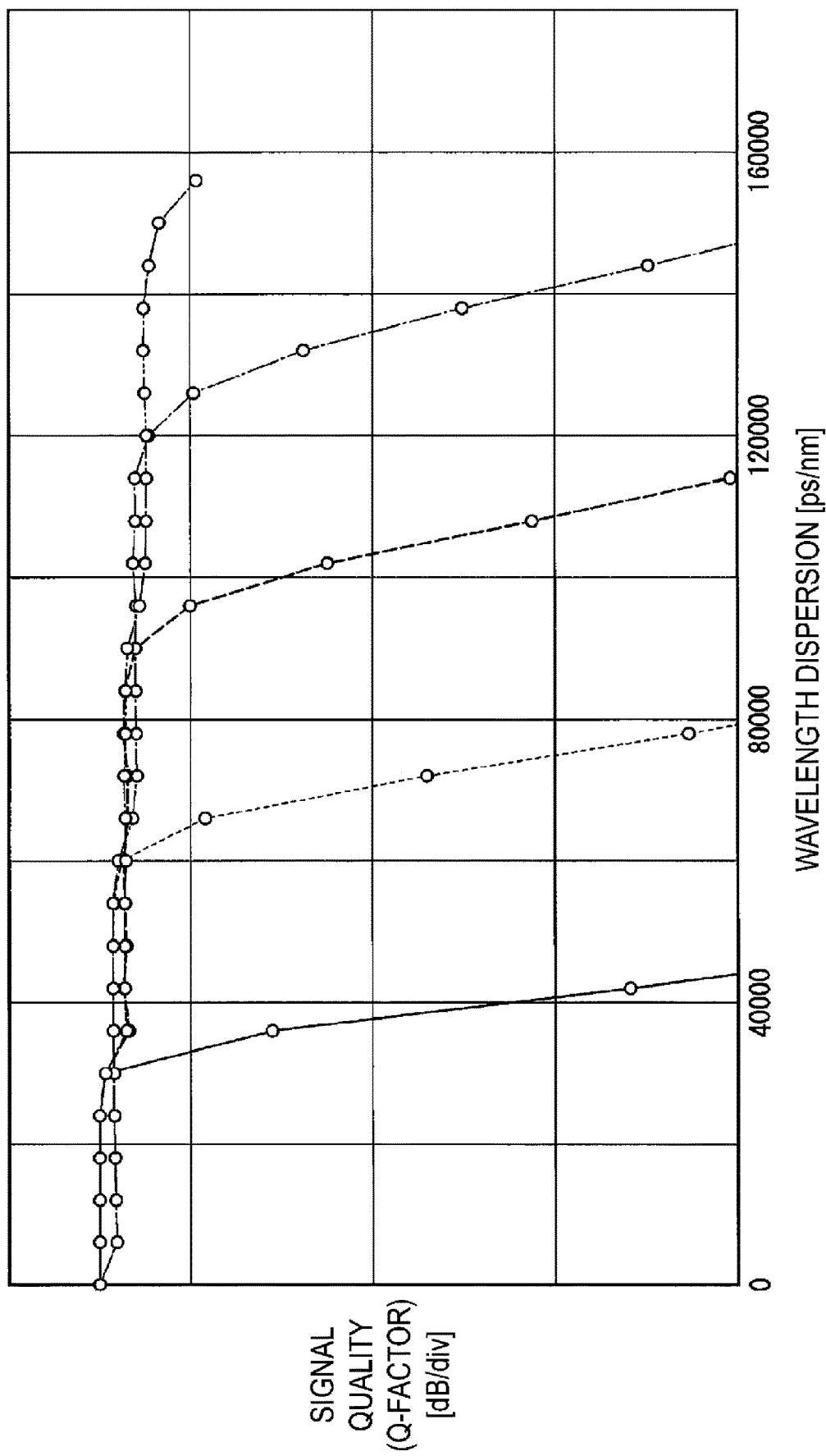
FIG. 12 is simulation results (no. 1) to which the wavelength dispersion compensation unit is applied according to the present embodiment.
Figure 13:
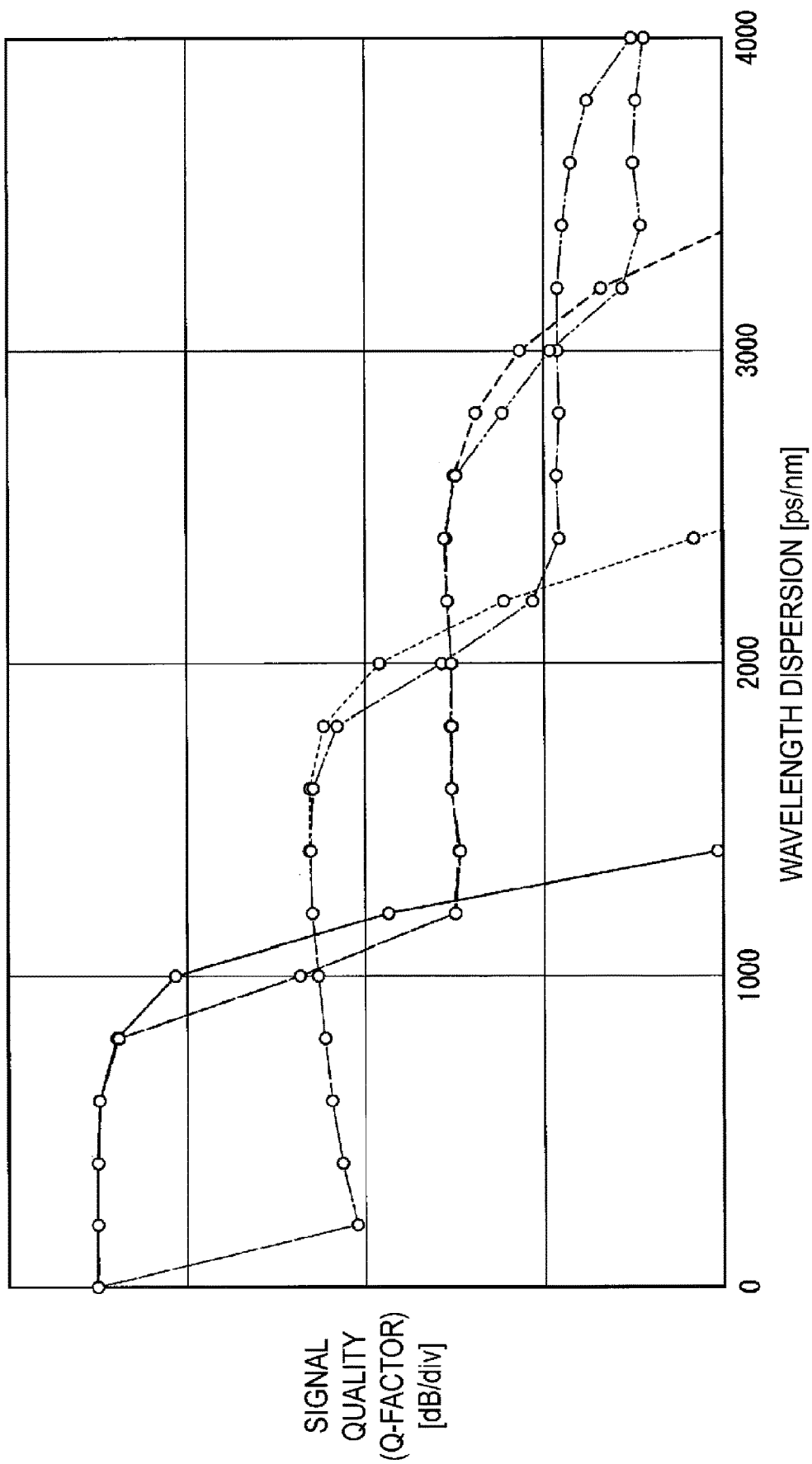
FIG. 13 is simulation results (no. 2) to which the wavelength dispersion compensation unit is applied according to the present embodiment.
Figure 14:
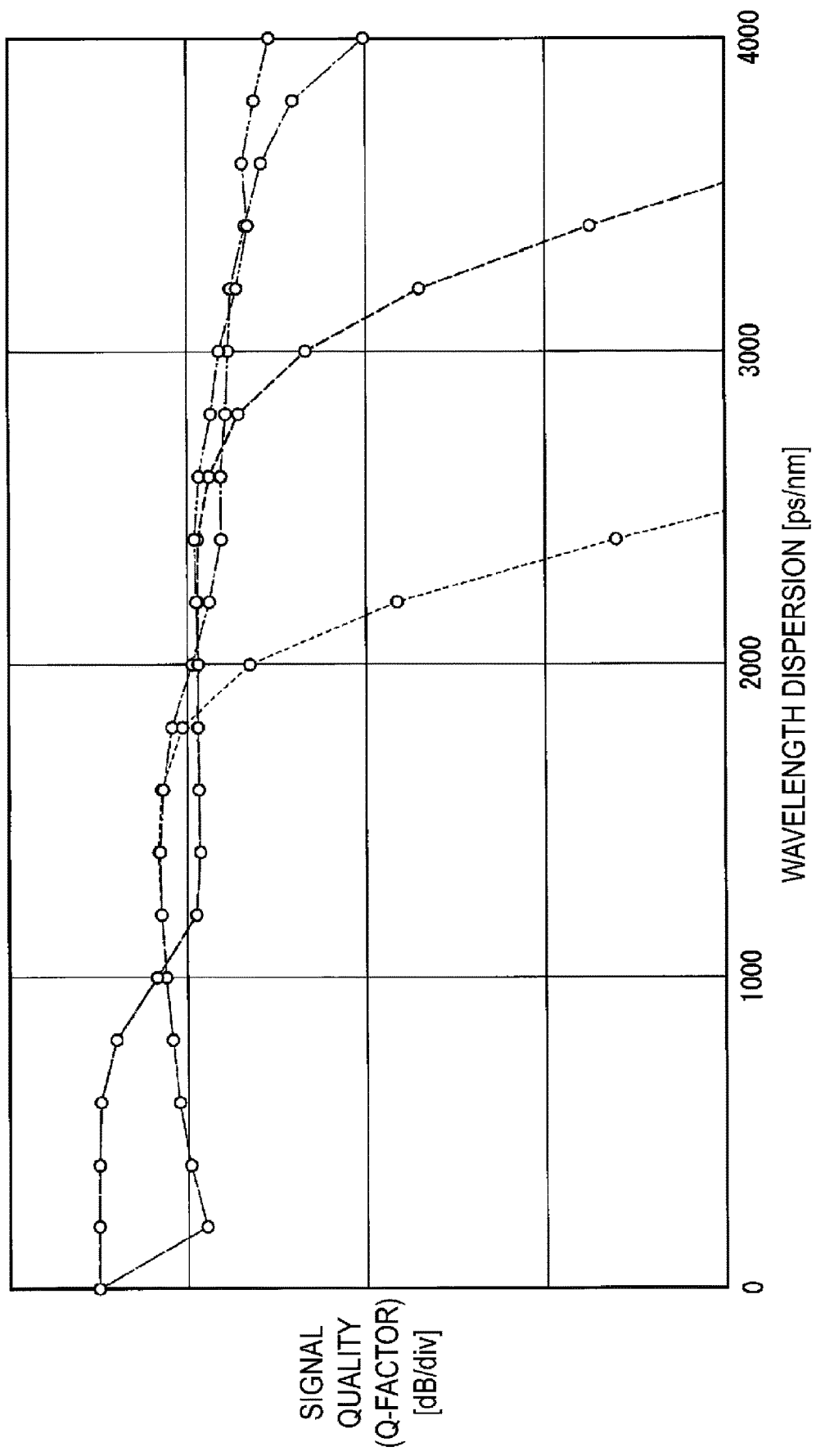
FIG. 14 is simulation results (no. 3) to which the wavelength dispersion compensation unit is applied according to the present embodiment.

FIG. 12, FIG. 13, and FIG. 14 are each a graph showing simulation results. In FIG. 12 to FIG. 14, the horizontal axis represents the wavelength dispersion amount, with its unit being [ps (picosecond)/nm (nanometer)]. The vertical axis represents signal quality by a Q-factor, with its unit being [dB]. Although the values are not shown, one scale corresponds to 1 dB.

In FIG. 12 to FIG. 14, the solid line indicates variation of a case of a general configuration illustrated in FIG. 3 in which the stage number is a single stage. The dotted line indicates variation of a case of a configuration illustrated in FIG. 5 and FIG. 10 in which the coefficient multiplication unit 33 has two stages, specifically, includes two multiplier arrays 70-1 and 70-2. The broken line indicates variation of a case of a configuration illustrated in FIG. 5 and FIG. 10 in which the coefficient multiplication unit 33 has three stages. The one-dot broken line indicates variation of a case of a configuration illustrated in FIG. 5 and FIG. 10 in which the coefficient multiplication unit 33 has four stages. The two-dot broken line indicates variation of a case of a configuration illustrated in FIG. 5 and FIG. 10 in which the coefficient multiplication unit 33 has five stages.

FIG. 12 shows a case in which the number N of the values included in the block satisfies N=2048, and the shape of the band-pass filter is a rectangular shape. Based on the variation of the graph shown in FIG. 12, it can be understood that by increasing the number of the stage numbers 60-1, 60-2, . . . , the compensation amount of wavelength dispersion can be increased without increasing the magnitude and the number of times of Fourier transformation and inverse Fourier transformation.

FIG. 13 shows a case in which the number N of the values included in the block satisfies N=64, and the shape of the band-pass filter is a rectangular shape. In contrast, FIG. 14 shows a case in which N=64, and the band-pass filter has a shape obtained by giving roll-off of 0.1 to the band-pass filter. Based on the variation of the graph shown in FIG. 13, it can be understood that, when the number N of the values included in the block is small, appropriate signal quality cannot be obtained with the band-pass filter having a rectangular shape. In contrast, based on the variation of the graph shown in FIG. 14, it can be understood that, even when the number N of the values included in the block is small, characteristics deterioration caused due to reduction of the value of N can be alleviated by giving roll-off to the band-pass filter.

Note that the examples of FIG. 12 to FIG. 14 are all examples in which the band-pass filter $B_1$ (ω) is applied in the equation (3). If the band-pass filter $B_1$ (ω) is not applied, the stepwise characteristics shown in FIG. 12 and FIG. 14 cannot be obtained, and regardless of the value of N, characteristics deterioration as shown in FIG. 13 appears.

The relationship between the wavelength dispersion compensation amount and N×stage number is wavelength dispersion compensation amount ∂N×stage number, specifically, a relationship in which the wavelength dispersion compensation amount is proportional to N×stage number. Thus, in order to increase the wavelength dispersion compensation amount, it is only required that either one or both of N and the stage number be increased. However, increasing N and the stage number leads to increasing the circuit scale of the coefficient multiplication unit 33, and accordingly it is necessary to consider which of N and the stage number is preferable to be increased.

In order to increase the wavelength dispersion compensation amount of the coefficient multiplication unit 33 itself, it is only required that N be increased. For example, by adjusting the value of N according to the transmission distance, such as by setting N to 2048 when the optical transmission path 4 having a transmission distance of several thousands of kilometers is used and setting N to 64 when the optical transmission path 4 having a transmission distance of approximately 100 km is used, the coefficient multiplication unit 33 having an appropriate circuit scale can be obtained.

However, the value of N is fixed by a circuit to be configured. In contrast, the stage number can be flexibly changed. For example, with the coefficient multiplication unit 33 having a five-stage configuration being provided, it is possible to use only two stages depending on a situation. In this case, regarding the unused three stages, it is also possible to inhibit power consumption of the three stages by stopping the clock.

Thus, it can be said that a configuration of flexibly reducing power consumption by setting N to a small value in advance and changing the stage number as appropriate is a desirable configuration. For example, if N is set to 2048, the wavelength dispersion compensation amount can only be changed in increments of 1000 km in conversion into the transmission distance, whereas if N is set to 64, the wavelength dispersion compensation amount can be changed in increments of 40 km.

In this manner, in the optical reception apparatus 2, by selecting appropriate N in advance, the optical reception apparatus 2 can serve both as an apparatus for short distance communication for which low power consumption is required and an apparatus for long distance communication without a significant restriction being imposed on the power consumption.

From the point of view of the operation amount, fast Fourier transformation and inverse fast Fourier transformation each require N×log(N) times of multiplication. If the stage number is L, in the coefficient multiplication unit 33, N×L times of multiplication is required. Thus, a total number of times of multiplication is 2×N×log(N)+N×L. As described above, the wavelength dispersion compensation amount is determined by N×L, and thus it is necessary that N and L be selected so as to obtain the smallest operation amount that satisfies a necessary wavelength dispersion compensation amount.

Figure 15:
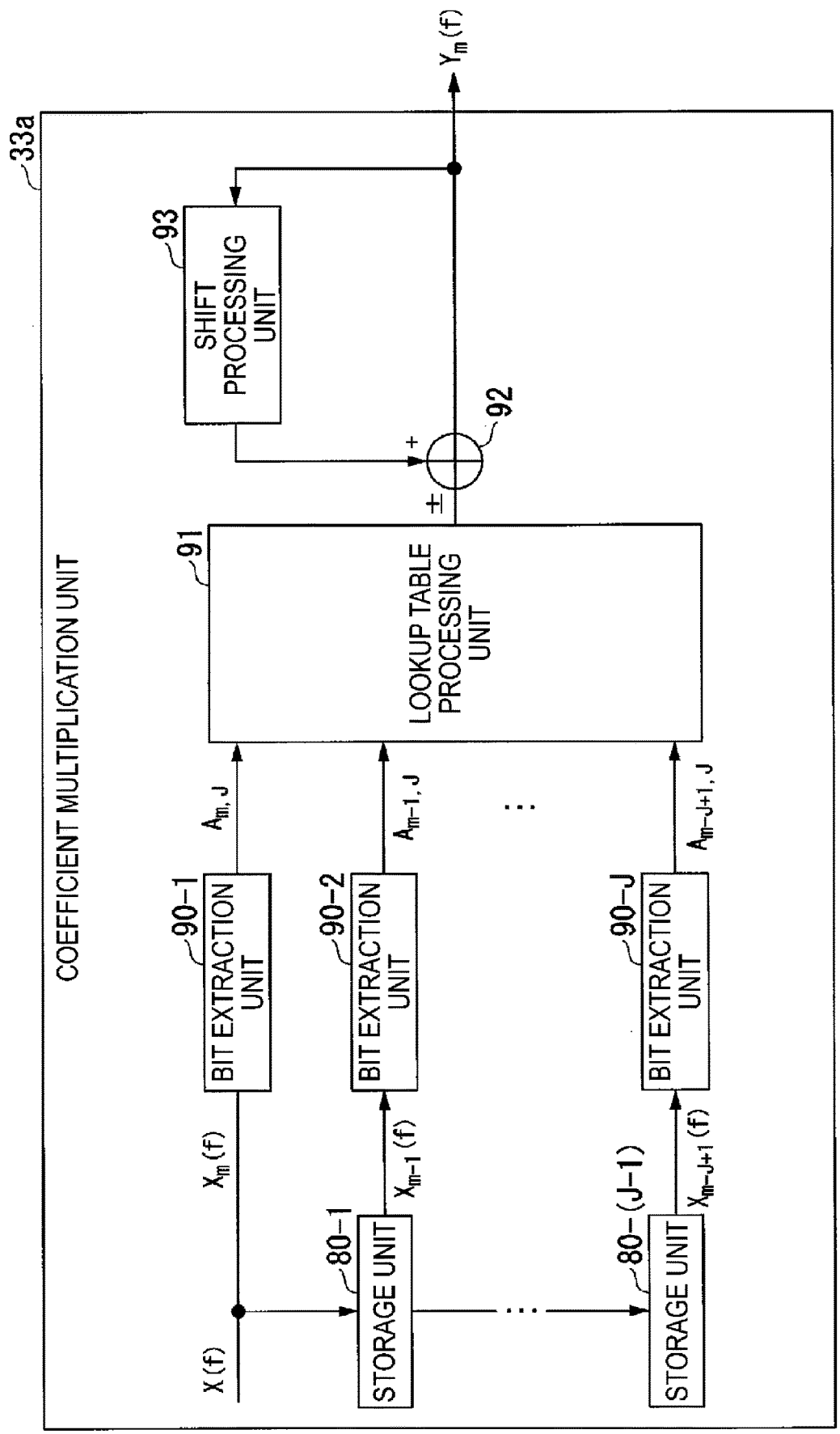
FIG. 15 is a block diagram illustrating another configuration example of the coefficient multiplication unit according to the present embodiment.

Other Configuration Examples of Coefficient Multiplication Unit Instead of the configuration of the coefficient multiplication unit 33 illustrated in FIG. 5 and FIG. 10, a coefficient multiplication unit 33a illustrated in FIG. 15 may be applied. The operation performed by the coefficient multiplication unit 33 is, as shown in the equation (8), multiply-accumulate operation of each of the frequency components $X_m$ (f), $X_{m-1}$ (f), . . . and the coefficients $H_0$ (f), $H_1$ (f), . . . .

The last expression of the equation (8) can be expressed as an inner product of two vectors as shown in the following equation (9). When such an inner product of two vectors is calculated, a distributed arithmetic (DA) method can be applied. Here, when $X_{m-j}$ (f) of the equation (9) is expressed as a complement of 2 of the length of B bits, $X_{m-j}$ (f) can be expressed as the equation (10).

[Math. 9]

$$Y_m(f) = \sum_{j=0}^{J-1} H_j(f) \times X_{m-j}(f) \ (H_0(f), H_1(f), \ldots, H_{J-1}(f)) \begin{pmatrix} X_m(f) \\ X_{m-1}(f) \\ \vdots \\ X_{m-J+1}(f) \end{pmatrix} \quad (9)$$

[Math. 10]

$$X_{m-j}(f) = -A_{m-j,0}(f) + \sum_{p}^{B-1} A_{m-j,p}(f) 2^{-p} \quad (10)$$

In the equation (10), $A_{m-j,p}$ represents a value of the p-th bit of $X_{m-j}$ (f) and is a value of 0 or 1. $A_{m-j,0}$ of the first term on the right-hand side is a code bit. Here, a vector as in the following equation (11) is defined.

[Math. 11]

$$(F_0(f), F_1(f), \ldots, F_{B-1}(f)) = (-2^0, 2^{-1}, \ldots, 2^{-(B-1)}) \quad (11)$$

With the use of the equation (10) and the equation (11), by deforming the last expression of the equation (9), the last expression can be expressed as the expression (12).

[Math. 12]

$$\underbrace{(H_0(f), \ldots, H_{J-1}(f)) \begin{pmatrix} A_{m,0}(f) & \cdots & A_{m,B-1}(f) \\ \vdots & \ddots & \vdots \\ A_{m-J+1,0}(f) & \cdots & A_{m-J+1,B-1}(f) \end{pmatrix}}_{\text{LUT PROCESSING}} \underbrace{\begin{pmatrix} F_0(f) \\ \vdots \\ F_{B-1}(f) \end{pmatrix}}_{\text{SHIFT PROCESSING}} \quad (12)$$

In the expression (12), the operation of the first two vectors can be implemented by memory reference with an input value being the p-th bit of $X_{m-j}$ (f) (where j is 0 to J−1), specifically, look up table (LUT) processing. The operation of the last vector can be implemented by shift processing of shifting one unit time.

Here, the configuration of the coefficient multiplication unit 33a illustrated in FIG. 15 will be described. Note that configurations the same as those of FIG. 10 are denoted by the same reference signs, and different configurations will be described below. The coefficient multiplication unit 33a includes storage units 80-1 to 80-(J−1), bit extraction units 90-1 to 90-J, a lookup table processing unit (lookup table processor) 91, an adder 92, and a shift processing unit (shift processor) 93.

Each of the bit extraction units 90-1 to 90-J extracts a bit sequence of $X_m$ (f), $X_{m-1}$ (f), . . . , $X_{m-J+1}$ (f), being corresponding input information, for each bit from the start, and outputs the bit sequence to the lookup table processing unit 91.

The lookup table processing unit 91 stores, in its internal storage area, coefficient multiplication results associated with 2J bit patterns that are calculated in advance. Here, the coefficient multiplication results for each bit pattern are values as below. The pattern of bits output by the bit extraction units 90-1 to 90-J is any one of 2J bit patterns with J being a bit length. Each of the bit values included in the bit pattern is multiplied by the coefficients $H_0$ (f), $H_1$ (f), . . . , $H_{J-1}$ (f) sequentially from the initial bit, and a total value of the multiplication results is thereby calculated. The total value corresponding to each of the 2J bit patterns is the coefficient multiplication results corresponding to each of the 2J bit patterns.

The lookup table processing unit 91 performs the LUT processing shown in the expression (12). Specifically, when the lookup table processing unit 91 is given the bit patterns from the bit extraction units 90-1 to 90-J, the lookup table processing unit 91 refers to the internal storage area without performing multiplication operation and reads the coefficient multiplication results associated with the given bit patterns.

The adder 92 adds an output value of the shift processing unit 93 and an output value of the lookup table processing unit 91 according to positive and negative signs. The shift processing unit 93 performs the shift processing shown in the expression (12). Specifically, the shift processing unit 93 internally includes a storage area, and stores an immediately preceding output value of the adder 92 in the internal storage area. Then, at the timing when the lookup table processing unit 91 outputs the coefficient multiplication results, the shift processing unit 93 multiplies the value stored by the internal storage area by ½ (=$2^{-1}$). In this manner, the coefficient multiplication unit 33a can calculate $Y_m$ (f) without performing the multiplication operation.

Note that, in the configuration according to the embodiment described above, the waveform shaping unit 13 may pre-equalize inverse characteristics of a transfer function of an analog device used in the optical transmission apparatus 1 and the optical transmission path 4 when the waveform shaping unit 13 performs the Nyquist filtering or the like.

In the digital signal processing, the wavelength dispersion compensation unit 23 may compensate for the transfer function of the analog device of the optical reception apparatus 2 collectively.

The demapping unit 25 may perform soft decision of outputting likelihood of received bits according to a reception point when the demapping unit 25 performs conversion into bit information.

The wavelength dispersion compensation unit 23 including the coefficient multiplication unit 33 or the coefficient multiplication unit 33a according to the embodiment described above may be used as a single wavelength dispersion compensation apparatus and be incorporated into the optical reception apparatus 2. The wavelength dispersion compensation apparatus may be implemented with a computer. In such a case, it may be implemented by recording a program for implementing the function in a computer-readable recording medium, causing a computer system to read the program recorded in the recording medium, and executing the program. Note that the "computer system" as used herein includes an OS and hardware such as a peripheral device. The "computer-readable recording medium" refers to a portable medium such as a flexible disk, a magneto-optical disk, a ROM, and a CD-ROM, and a storage apparatus such as a hard disk installed in a computer system. Further, the "computer-readable recording medium" may also include such a medium that stores programs dynamically for a short period of time, one example of which is a communication line used when a program is transmitted via a network such as the Internet and a communication line such as a telephone line, and may also include such a medium that stores programs for a certain period of time, one example of which is a volatile memory inside a computer system that functions as a server or a client in the above-described case. The above program may be a program for implementing a part of the above-mentioned functions. The above program may be a program capable of implementing the above-mentioned functions in combination with another program already recorded in a computer system. The above program may be a program to be implemented with the use of a programmable logic device such as a field programmable gate array (FPGA).

The embodiment of the present invention has been described above in detail with reference to the drawings. However, specific configurations are not limited to the embodiment, and include any design or the like within the scope not departing from the gist of the present invention.

REFERENCE SIGNS LIST

1 . . . Optical transmission apparatus
2 . . . Optical reception apparatus

4 ... Optical transmission path
23 ... Wavelength dispersion compensation unit
31 ... Block division unit
32 ... Fourier transform unit
33 ... Coefficient multiplication unit
34 ... Inverse Fourier transform unit
35 ... Overlap cut unit

The invention claimed is:

1. A wavelength dispersion compensation apparatus comprising:
   a block divider configured to segment an electric digital received signal obtained from a received optical signal into blocks of a certain length with an overlap of a length determined in advance with an adjacent block and output the blocks;
   a Fourier transformer configured to perform Fourier transformation for each of the blocks output by the block divider;
   a coefficient multiplier configured to store a plurality of the blocks converted by the Fourier transformer consecutively in time series, apply a coefficient determined based on a wavelength dispersion compensation amount according to one of frequency positions and a delay amount according to one of the frequency positions and one of time positions to frequency component values included in the plurality of the blocks that are stored, and generate blocks with the coefficient applied, the blocks with the coefficient applied being obtained by adding up frequency component values with the coefficient applied for each of the frequency positions;
   an inverse Fourier transformer configured to perform inverse Fourier transformation on the blocks with the coefficient applied that are generated by the coefficient multiplier; and
   an overlap cutter configured to remove a part of the overlap from the blocks with the coefficient applied that are converted by the inverse transformer,
   wherein each of the block divider, the Fourier transformer, the coefficient multiplier, the inverse Fourier transformer and the overlap cutter is implemented by:
   i) computer executable instructions executed by at least one processor,
   ii) at least one circuitry or
   iii) a combination of computer executable instructions executed by at least one processor and at least one circuitry.

2. The wavelength dispersion compensation apparatus according to claim 1,
   wherein the coefficient multiplier includes
   an adder and
   as many multiplier arrays as a number matching the number of the plurality of the blocks stored by the wavelength dispersion compensation amount,
   the multiplier arrays include as many multipliers as a number matching a length of the plurality of the blocks,
   each of the plurality of the multiplier arrays fetches a corresponding one of the blocks, multiplies, by the coefficient, a frequency value included in the corresponding one of the blocks that is fetched, and outputs a multiplication result, and
   the adder generates the blocks with the coefficient applied by adding up the frequency value included in the blocks output by the plurality of the multiplier arrays for each of the frequency positions,
   wherein each of the adder, and the multiplier arrays are implemented by:
   i) computer executable instructions executed by at least one processor,
   ii) at least one circuitry or
   iii) a combination of computer executable instructions executed by at least one processor and at least one circuitry.

3. The wavelength dispersion compensation apparatus according to claim 1,
   wherein the coefficient multiplier includes
   an adder,
   a lookup table processor configured to store coefficient multiplication results associated with all of bit patterns of a bit sequence of a bit length matching the number of the plurality of the blocks, in an internal storage area in advance, and
   a shift processor configured to multiply an immediately preceding output value of the adder by ½ and output a resulting value,
   the lookup table processor fetches a plurality of bit values corresponding to an identical bit position of the plurality of the blocks stored by the wavelength dispersion compensation amount, reads, from the internal storage area, the coefficient multiplication results associated with the bit patterns of the plurality of bit values that are fetched, and outputs the coefficient multiplication results, and
   the adder generates the blocks with the coefficient applied by repeatedly performing addition of the coefficient multiplication results output by the lookup table processor and the resulting value output from the processor according to positive and negative signs for all of bits of the blocks and outputs the blocks with the coefficient applied,
   wherein each of the adder, the lookup table processor and the shift processor is implemented by:
   i) computer executable instructions executed by at least one processor,
   ii) at least one circuitry or
   iii) a combination of computer executable instructions executed by at least one processor and at least one circuitry.

4. The wavelength dispersion compensation apparatus according to claim 1,
   wherein the coefficient is determined based on the wavelength dispersion compensation amount according to one of the frequency positions, the delay amount according to one of the frequency positions and one of the time positions, and an attenuation amount of a band-pass filter of a bandwidth according to one of the frequency positions.

5. The wavelength dispersion compensation apparatus according to claim 4,
   wherein a shape of the band-pass filter is a rectangular shape or a shape to which roll-off is given.

6. An optical reception apparatus comprising the wavelength dispersion compensation apparatus according to claim 1 as a wavelength dispersion compensator,
   wherein the wavelength dispersion compensator is implemented by:
   i) computer executable instructions executed by at least one processor,
   ii) at least one circuitry or
   iii) a combination of computer executable instructions executed by at least one processor and at least one circuitry.

7. A wavelength dispersion compensation method comprising:

segmenting an electric digital received signal obtained from a received optical signal into blocks of a certain length with an overlap of a length determined in advance with an adjacent block;

performing Fourier transformation for each of the blocks;

storing a plurality of the blocks subjected to the Fourier transformation consecutively in time series, applying a coefficient determined based on a wavelength dispersion compensation amount according to one of frequency positions and a delay amount according to one of the frequency positions and one of time positions to frequency component values included in the plurality of the blocks that are stored, and generating blocks with the coefficient applied, the blocks with the coefficient applied being obtained by adding up frequency component values with the coefficient applied for each of the frequency positions;

performing inverse Fourier transformation on the generated blocks with the coefficient applied that are generated; and removing a part of the overlap subjected to the inverse Fourier transformation.

8. A non-transitory computer readable medium storing a computer program when executed by a computer causing the computer to execute:

segmenting an electric digital received signal obtained from a received optical signal into blocks of a certain length with an overlap of a length determined in advance with an adjacent block and outputting the blocks;

performing Fourier transformation for each of the blocks;

storing a plurality of the blocks subjected to the Fourier transformation consecutively in time series, applying a coefficient determined based on a wavelength dispersion compensation amount according to one of frequency positions and a delay amount according to one of the frequency positions and one of time positions to frequency component values included in the plurality of the blocks that is stored, and generating blocks with the coefficient applied, the blocks with the coefficient applied being obtained by adding up frequency component values with the coefficient applied for each of the frequency positions;

performing inverse Fourier transformation on the blocks with the coefficient applied that are generated; and removing a part of the overlap subjected to the inverse Fourier transformation.

* * * * *